United States Patent
Sun et al.

(10) Patent No.: US 11,923,399 B2
(45) Date of Patent: Mar. 5, 2024

(54) MICRO LIGHT EMITTING DIODE DISPLAY PANEL

(71) Applicant: PlayNitride Display Co., Ltd., MiaoLi County (TW)

(72) Inventors: Sheng-Yuan Sun, MiaoLi County (TW); Loganathan Murugan, MiaoLi County (TW); Po-Wei Chiu, MiaoLi County (TW); Yun-Li Li, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 442 days.

(21) Appl. No.: 17/218,173

(22) Filed: Mar. 31, 2021

(65) Prior Publication Data

US 2022/0246671 A1 Aug. 4, 2022

(30) Foreign Application Priority Data

Jan. 29, 2021 (TW) .................................. 110103387

(51) Int. Cl.
*H01L 27/15* (2006.01)
*H01L 33/46* (2010.01)

(52) U.S. Cl.
CPC .......... *H01L 27/156* (2013.01); *H01L 33/465* (2013.01)

(58) Field of Classification Search
CPC combination set(s) only.
See application file for complete search history.

(56) References Cited

U.S. PATENT DOCUMENTS

| 2012/0235169 A1* | 9/2012 | Seko | H01L 33/60 257/E33.059 |
|---|---|---|---|
| 2015/0003040 A1 | 1/2015 | Bessho et al. | |
| 2017/0229519 A1* | 8/2017 | Suzuki | G02B 5/201 |

(Continued)

FOREIGN PATENT DOCUMENTS

| CN | 106684108 | 5/2017 |
|---|---|---|
| CN | 110970546 | 4/2020 |

(Continued)

OTHER PUBLICATIONS

"Office Action of China Counterpart Application", dated Mar. 31, 2023, p. 1-p. 7.

(Continued)

*Primary Examiner* — Mark W Tornow
*Assistant Examiner* — Priya M Rampersaud
(74) *Attorney, Agent, or Firm* — JCIPRNET

(57) ABSTRACT

A micro light-emitting diode display panel includes a substrate, at least one light-emitting element, a reflective layer and a light-absorbing layer. The at least one light-emitting element is disposed on the substrate to define at least one pixel, and each light-emitting element includes micro light-emitting diodes. The reflective layer is disposed on the substrate and located between the micro light-emitting diodes. The reflective layer has cavities surrounding the micro light-emitting diodes, such that a thickness of a portion of the reflective layer close to any one of the micro light-emitting diodes is greater than a thickness of a portion of the reflective layer away from the corresponding micro light-emitting diode. The light-absorbing layer is at least disposed in the cavities of the reflective layer.

15 Claims, 12 Drawing Sheets

(56) References Cited

U.S. PATENT DOCUMENTS

| | | | |
|---|---|---|---|
| 2018/0102348 A1* | 4/2018 | Haiberger | H01L 33/54 |
| 2018/0233537 A1 | 8/2018 | Liu et al. | |
| 2019/0302350 A1* | 10/2019 | Yamaoka | H01L 33/60 |
| 2020/0044119 A1 | 2/2020 | Basin et al. | |
| 2020/0185453 A1* | 6/2020 | Cho | H01L 33/44 |
| 2020/0319391 A1 | 10/2020 | Vasylyev et al. | |
| 2021/0005583 A1 | 1/2021 | Iguchi et al. | |
| 2021/0151702 A1* | 5/2021 | Fan | H10K 50/115 |
| 2021/0202449 A1* | 7/2021 | Shin | H01L 25/0753 |

FOREIGN PATENT DOCUMENTS

| | | |
|---|---|---|
| CN | 111370560 | 7/2020 |
| CN | 111490061 | 8/2020 |
| TW | I686566 | 3/2020 |
| WO | 2020122492 | 6/2020 |
| WO | 2020157149 | 8/2020 |

OTHER PUBLICATIONS

"Office Action of Taiwan Counterpart Application", dated Aug. 6, 2021, p. 1-p. 5.
"Office Action of China Counterpart Application", dated Nov. 18, 2022, p. 1-p. 7.

* cited by examiner

MICRO LIGHT EMITTING DIODE DISPLAY PANEL

CROSS-REFERENCE TO RELATED APPLICATION

This application claims the priority benefit of Taiwan application serial no. 110103387, filed on Jan. 29, 2021. The entirety of the above-mentioned patent application is hereby incorporated by reference herein and made a part of this specification.

BACKGROUND

1. Technical Field

The disclosure relates to a display panel, and in particular relates to a micro light-emitting diode display panel.

2. Description of Related Art

Conventional micro light-emitting diode display panels fill the gaps between the micro light-emitting diodes with black matrixes in order to increase the contrast, but such design will greatly reduce the brightness of the panel.

SUMMARY

The disclosure provides a micro light-emitting diode display panel having high contrast and high brightness.

A micro light-emitting diode display panel of the disclosure includes a substrate, at least one light-emitting element, a reflective layer and a light-absorbing layer. The at least one light-emitting element is disposed on the substrate to define at least one pixel, and each of the at least one light-emitting element includes multiple micro light-emitting diodes. The reflective layer is disposed on the substrate and located between the micro light-emitting diodes. The reflective layer has multiple cavities surrounding the multiple micro light-emitting diodes, such that a thickness of a portion of the reflective layer close to any one of the micro light-emitting diodes is greater than a thickness of a portion of the reflective layer away from the corresponding micro light-emitting diode. The light-absorbing layer is at least disposed in the multiple cavities of the reflective layer.

In an embodiment of the disclosure, each of the micro light-emitting diodes includes a top surface away from the substrate, and a depth of each of the multiple cavities is less than or equal to a distance from the top surface to the substrate.

In an embodiment of the disclosure, a width of a portion of the reflective layer between any two adjacent micro light-emitting diodes of the adjacent micro light-emitting diodes is greater than or equal to a width of the corresponding portion of the light-absorbing layer.

In an embodiment of the disclosure, a ratio of a width of the light-absorbing layer to a width of the reflective layer is between 0.9 and 1.

In an embodiment of the disclosure, the multiple micro light-emitting diodes include a first micro light-emitting diode, a second micro light-emitting diode, and a third micro light-emitting diode; light emitted by the first micro light-emitting diode, light emitted by the second micro light-emitting diode, and light emitted by the third micro light-emitting diode have different wavelengths.

In an embodiment of the disclosure, the wavelength of the light emitted by the first micro light-emitting diode is greater than the wavelength of the light emitted by the second micro light-emitting diode as well as the light emitted by the third micro light-emitting diode, and a light-emitting layer of the first micro light-emitting diode is surrounded by the reflective layer.

In an embodiment of the disclosure, the first micro light-emitting diode, the second micro light-emitting diode, the third micro light-emitting diode respectively includes multiple first side walls, multiple second side walls, and multiple third side walls, and the reflective layer contacts 30% to 100% of each of the multiple first side walls, 30% to 100% of each of the multiple second side walls, and 30% to 100% of each of the multiple third side walls.

In an embodiment of the disclosure, a height of the reflective layer beside the multiple first side walls is different from a height of the reflective layer beside the multiple third side walls.

In an embodiment of the disclosure, the reflective layer contacts 70% to 100% of each of the multiple first side walls, 30% to 100% of each of the multiple second side walls, and 30% to 100% of each of the multiple third side walls.

In an embodiment of the disclosure, the light-absorbing layer contacts a portion of each of the multiple first side walls, a portion of each of the multiple second side walls, and a portion of each of the multiple third side walls.

In an embodiment of the disclosure, the light-absorbing layer has a light-absorbing surface away from the reflective layer, and the light-absorbing surface is a concave surface.

In an embodiment of the disclosure, each of the micro light-emitting diodes includes a top surface away from the substrate, and a maximum distance between the light-absorbing layer and the substrate is greater than or equal to a distance between the top surface and the substrate.

In an embodiment of the disclosure, the reflective layer further includes multiple through holes communicated with the multiple cavities, and the light-absorbing layer fills the through holes and contacts the substrate.

In an embodiment of the disclosure, a first interval is provided between any two adjacent micro light-emitting diodes of the adjacent micro light-emitting diodes where the at least one light-emitting element includes two light-emitting elements, and a second interval is provided between the two light-emitting elements; the second interval is greater than the first interval, and a thickness of the reflective layer in a portion between the two light-emitting elements close to the two light-emitting elements is greater than a thickness of the reflective layer in a portion between the two light-emitting elements away from the two light-emitting elements.

In an embodiment of the disclosure, the first interval is between 1 μm and 50 μm, and the second interval is between 50 μm and 300 μm.

In an embodiment of the disclosure, an optical density of the light-absorbing layer is greater than 1, and a reflectivity of the reflective layer is greater than 50%.

Based on the above, in the micro light-emitting diode display panel of the disclosure, the reflective layer is disposed on the substrate and located between the micro light-emitting diodes. The reflective layer has multiple cavities surrounding the micro light-emitting diodes, such that a thickness of a portion of the reflective layer close to any one of the micro light-emitting diodes is greater than a thickness of a portion of the reflective layer away from the corresponding micro light-emitting diode. The light-absorbing layer is at least disposed in the multiple cavities of the reflective layer. With such design, the portion of the reflective layer close to the micro light-emitting diode is thicker, which can increase the reflective ratio, such that the lateral light of the micro light-emitting diode can be almost reflected, thereby improving the light-emitting efficiency. The portion of the reflective layer away from the micro light-emitting diode is thinner, such that a corresponding portion of the light-absorbing layer is thicker, which can increase the absorbance of the ambient light, so as to improve the color-light contrast. That is to say, with the double-layer structure design of disposing a reflective layer and a light-absorbing layer beside the micro light-emitting diodes, the micro light-emitting diode display panel of the disclosure can have high contrast and high brightness.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
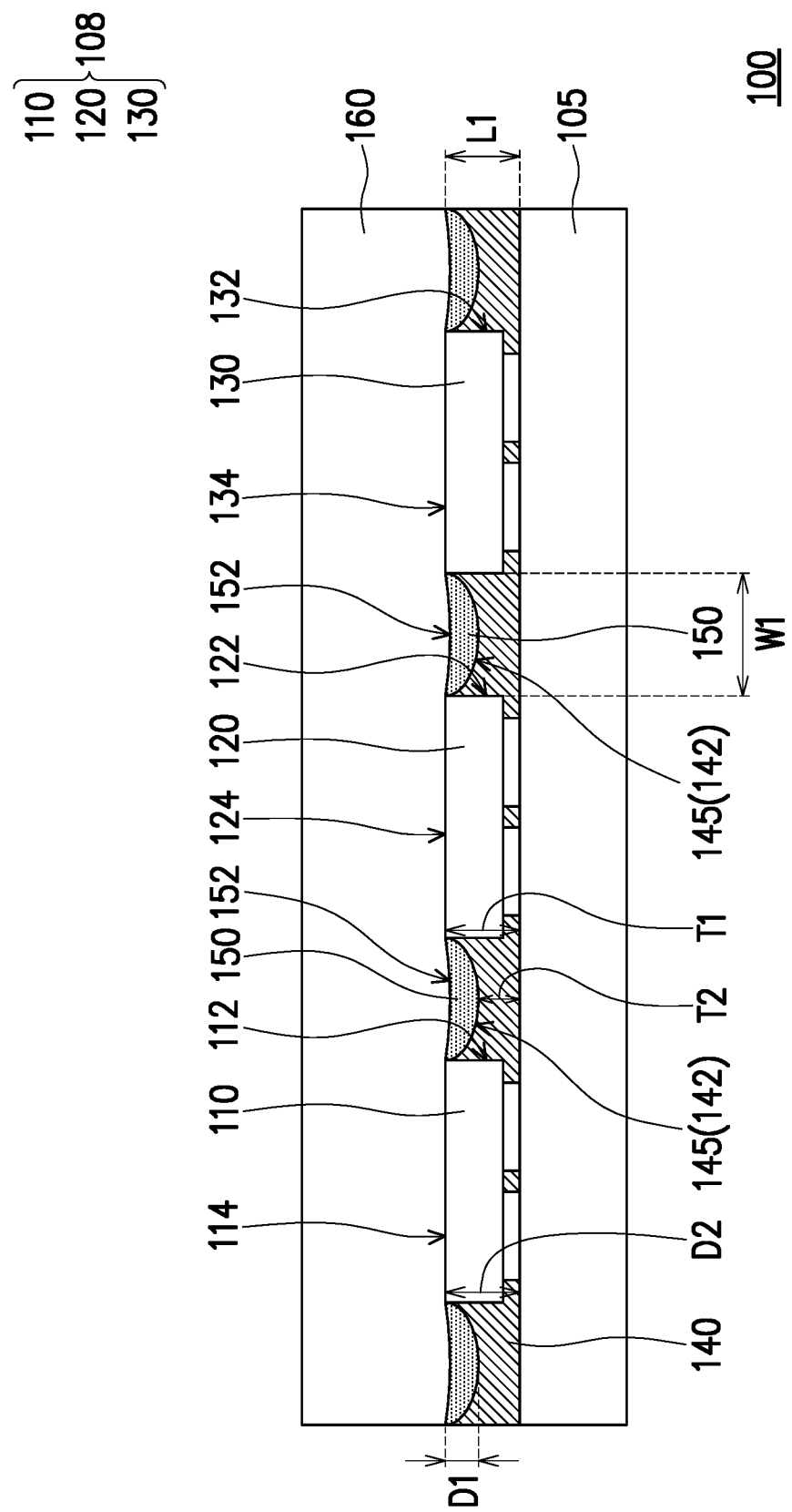
FIG. 1 is a schematic diagram of a partial profile of a micro light-emitting diode display panel according to an embodiment of the disclosure.

Reference will now be made in detail to the exemplary embodiments of the disclosure, examples of which are illustrated in the accompanying drawings. Wherever possible, the same reference numbers are used in the drawings and the description to refer to the same or like parts.

FIG. 1 is a schematic diagram of a partial profile of a micro light-emitting diode display panel according to an embodiment of the disclosure. Referring to FIG. 1, in the present embodiment, a micro light-emitting diode display panel 100 includes a substrate 105, at least one light-emitting element 108, a reflective layer 140, and a light-absorbing layer 150.

The at least one light-emitting element 108 is disposed on the substrate 105 to define at least one pixel. In FIG. 1, a set of light-emitting element 108 is used as an illustration to define a pixel, but the number of light-emitting elements 108 is not limited. In other embodiments, the light-emitting element 108 may be multiple sets, and the multiple pixels formed by the light-emitting elements 108 may be arranged in an array.

The light-emitting element 108 includes multiple micro light-emitting diodes, such as a first micro light-emitting diode 110, a second micro light-emitting diode 120, and a third micro light-emitting diode 130. Light emitted by the first micro light-emitting diode 110, light emitted by the second micro light-emitting diode 120, and light emitted by the third micro light-emitting diode 130 have different wavelengths with different colors.

Specifically, in the present embodiment, the wavelength of the light emitted by the first micro light-emitting diode 110 is greater than the wavelength of the light emitted by the second micro light-emitting diode 120, and the wavelength of the light emitted by the second micro light-emitting diode 120 is greater than the light emitted by the third micro light-emitting diode 130. For example, the first micro light-emitting diode 110 is a red light micro light-emitting diode, the second micro light-emitting diode 120 is a green light micro light-emitting diode, and the third micro light-emitting diode 130 is a blue micro light-emitting diode. Of course, the types of the first micro light-emitting diode 110, the second micro light-emitting diode 120, and the third micro light-emitting diode 130 are not limited thereto.

As shown in FIG. 1, the first micro light-emitting diode 110 includes a first top surface 114 away from the substrate 105 and multiple first side walls 112. The second micro light-emitting diode 120 includes a second top surface 124 away from the substrate 105 and multiple second side walls 122. The third micro light-emitting diode 130 includes a third top surface 134 away from the substrate 105 and multiple third side walls 132.

The reflective layer 140 is disposed on the substrate 105 and covers at least a portion of each of the multiple first side walls 112, at least a portion of each of the multiple second side walls 122, and at least a portion of each of the multiple third side walls 132.

The reflective layer 140 may almost reflect lateral light of the first micro light-emitting diode 110, the second micro light-emitting diode 120, and the third micro light-emitting diode 130, thereby improving light-emitting efficiency. In the present embodiment, a material of the reflective layer 140 includes photoresist mixed with reflective particles, and the reflectivity of the reflective layer 140 is greater than 50%. Of course, the material and reflectivity of the reflective layer 140 are not limited thereto.

As shown in FIG. 1, the reflective layer 140 has multiple cavities 142 surrounding the first micro light-emitting diode 110, the second micro light-emitting diode 120, and the third micro light-emitting diode 130, such that a thickness T1 of a portion of the reflective layer 140 close to the first micro light-emitting diode 110, the second micro light-emitting diode 120, and the third micro light-emitting diode 130 is greater than a thickness T2 of a portion of the reflective layer 140 away from the first micro light-emitting diode 110, the second micro light-emitting diode 120, and the third micro light-emitting diode 130 (i.e. the center between two micro light-emitting diodes).

In the present embodiment, each of the cavities 142 of the reflective layer 140 has a concave shape, but the shape of the cavity 142 is not limited thereto. In the present embodiment, a depth D1 of the cavity 142 is less than a distance D2 from the first top surface 114 of the first micro light-emitting diode 110 to the substrate 105, and is also less than a distance from the second top surface 124 of the second micro light-emitting diode 120 to the substrate 105 as well as a distance from the third top surface 134 of the third micro light-emitting diode 130 to the substrate 105. Of course, the depth of cavity 142 is not limited thereto.

The light-absorbing layer 150 is at least disposed inside the cavities 142 of the reflective layer 140, and annularly disposed outside the first micro light-emitting diode 110, the second micro light-emitting diode 120, and the third micro light-emitting diode 130. The light-absorbing layer 150 may be configured to absorb ambient light to improve contrast.

In the present embodiment, a material of the light-absorbing layer 150 includes photoresist, and the optical density of the light-absorbing layer 150 is greater than 1. The light-absorbing layer 150 has a light-absorbing surface 152 away from the reflective layer 140. The light-absorbing surface 152 is, for example, a concave surface, which may allow the lateral light emitted to be almost reflected and improve the light-emitting efficiency. The manufacturer may determine the depth of the light-absorbing surface 152 according to an absorption rate of the material of the light-absorbing layer 150. Of course, the material and the optical density of the light-absorbing layer 150 are not limited thereto.

It should be noted that in the present embodiment, since the light-absorbing layer 150 is disposed inside the cavities 142 of the reflective layer 140, the depth in a center of the cavity 142 is relatively deep, the light-absorbing layer 150 is thicker at a location away from the first micro light-emitting diode 110, the second micro light-emitting diode 120, and the third micro light-emitting diode 130. The thicker light-absorbing layer 150 can increase the absorbance of ambient light to further improve color-light contrast. In particular, the thicker thickness may be greater than or equal to 1 micron, which can increase the absorbance.

The micro light-emitting diode display panel 100 further includes a light-transmitting cover 160 disposed on the light-emitting element 108, the reflective layer 140, and the light-absorbing layer 150. The light-transmitting cover 160 has a high transmittance, and may allow the light emitted by the light-emitting element 108 to pass through.

The micro light-emitting diode display panel 100 of the present embodiment can have high contrast through the design of the light-absorbing layer 150. Also, by disposing the reflective layer 140 beside the first micro light-emitting diode 110, the second micro light-emitting diode 120, and the third micro light-emitting diode 130, the lateral light of the first micro light-emitting diode 110, the second micro light-emitting diode 120, and the third micro light-emitting diode 130 can be reflected back, thereby increasing the brightness of the micro light-emitting diode display panel 100, and high brightness and high contrast can be achieved at the same time.

The following will introduce other types of the micro light-emitting diode display panel. In the following embodiments, only the main differences between the different embodiments will be described, and the similarities will not be repeated.

Figure 2:
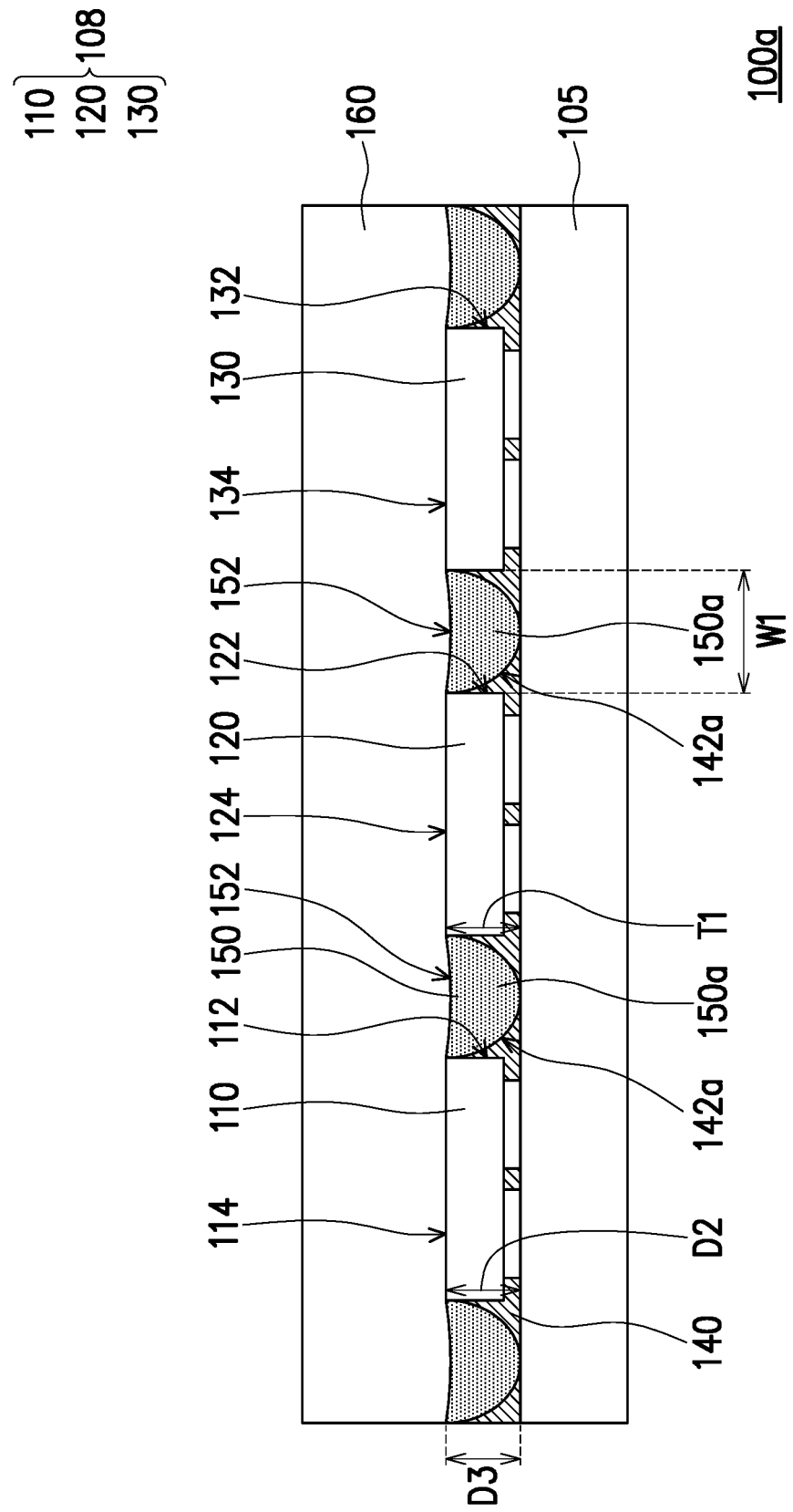
FIG. 2 is a schematic diagram of a partial profile of a micro light-emitting diode display panel according to another embodiment of the disclosure.

FIG. 2 is a schematic diagram of a partial profile of a micro light-emitting diode display panel according to another embodiment of the disclosure. Please refer to FIG. 2. The main difference between a micro light-emitting diode display panel 100a of FIG. 2 and the micro light-emitting diode display panel 100 of FIG. 1 is: in FIG. 1, the depth D1 of a cavity 142a is less than the distance D2 from the first top surface 114 of the first micro light-emitting diode 110 to the substrate 105. In the present embodiment, a ratio of a depth D3 of the cavity 142 to the distance from the first top surface 114 of the first micro light-emitting diode 110 to the substrate 105 is greater than or equal to 0.9. With such design, a light-absorbing layer 150a is thicker at a portion away from the first micro light-emitting diode 110, the second micro light-emitting diode 120, and the third micro light-emitting diode 130, thereby further increasing the color contrast. More preferably, the depth D3 of the cavity 142 is equal to the distance from the first top surface 114 of the first micro light-emitting diode 110 to the substrate 105, which can have better color contrast.

Figure 3:
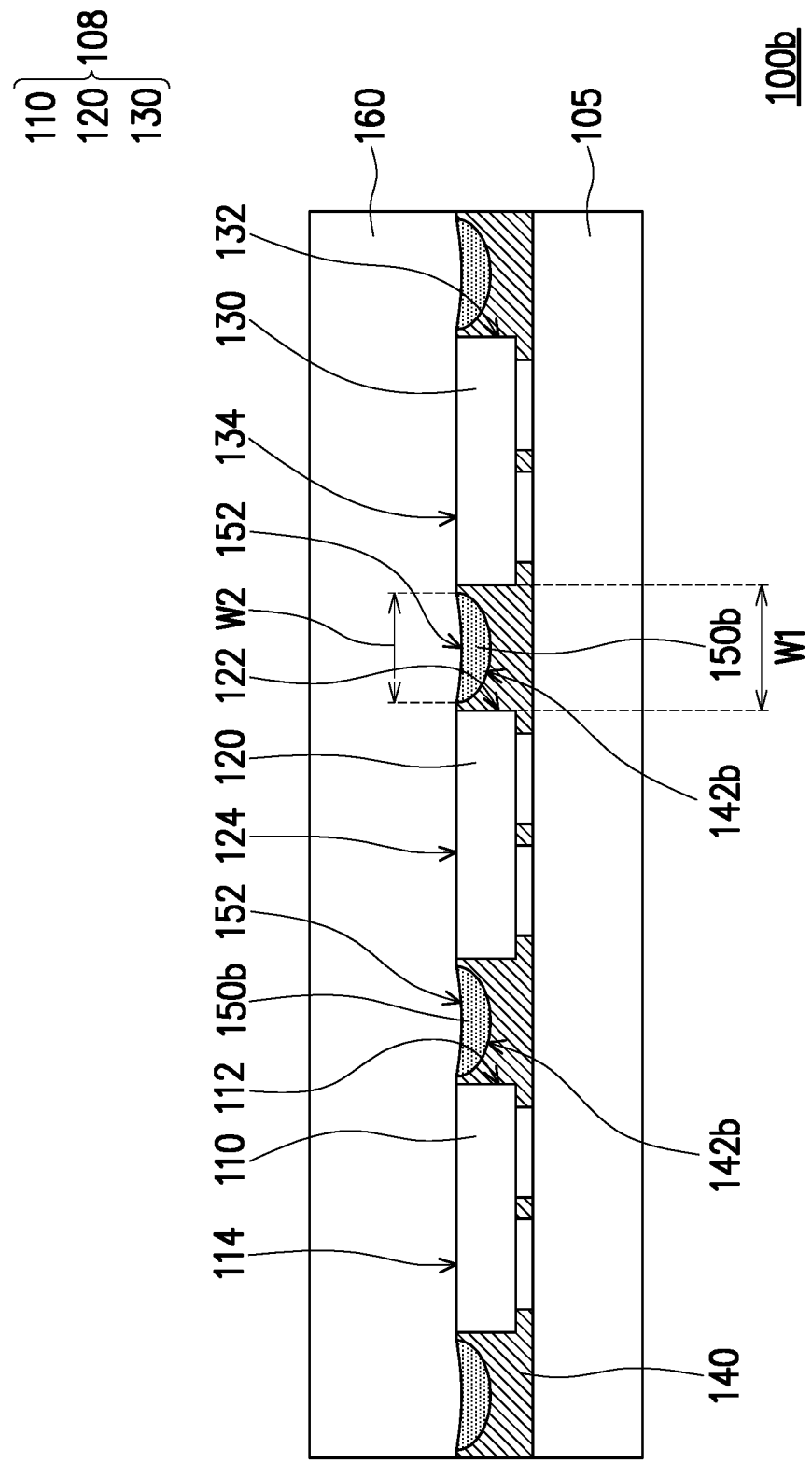
FIG. 3 is a schematic diagram of a partial profile of a micro light-emitting diode display panel according to another embodiment of the disclosure.

FIG. 3 is a schematic diagram of a partial profile of a micro light-emitting diode display panel according to another embodiment of the disclosure. Please refer to FIG. 3. The main difference between a micro light-emitting diode display panel 100b of FIG. 3 and the micro light-emitting diode display panel 100 of FIG. 1 is: in the present embodiment, a width W1 of a portion of the reflective layer 140 between any two adjacent ones of the first micro light-emitting diode 110, the second micro light-emitting diode 120, and the third micro light-emitting diode 130 is greater than a width W2 of a portion of the light-absorbing layer 150b between any two adjacent ones of the first micro light-emitting diode 110, the second micro light-emitting diode 120, and the third micro light-emitting diode 130, such that the light-absorbing layer 150b does not directly contact the first side wall 112 of the first micro light-emitting diode 110, the second side wall 122 of the second micro light-emitting diode 120, and the third side wall 132 of the third micro light-emitting diode 130.

In other words, in the present embodiment, the reflective layer 140 covers the entire first side wall 112 of the first micro light-emitting diode 110, the entire second side wall 122 of the second micro light-emitting diode 120, and the entire third side wall 132 of the third micro light-emitting diode 130, such that reflectivity of the lateral light of the first micro light-emitting diode 110, the second micro light-emitting diode 120, and the third micro light-emitting diode 130 is improved.

In the present embodiment, a ratio (W2/W1) of the width W2 of the light-absorbing layer 150b between any two adjacent ones of the first micro light-emitting diode 110, the second micro light-emitting diode 120, and the third micro light-emitting diode 130 to the width W1 of the reflective layer 140 between any two adjacent ones of the first micro light-emitting diode 110, the second micro light-emitting diode 120, and the third micro light-emitting diode 130 is between 0.9 and 1. The ratio can ensure that the micro light-emitting diode display panel 100b has sufficient contrast; if the ratio is too small, the contrast effect will be reduced.

Figure 4:
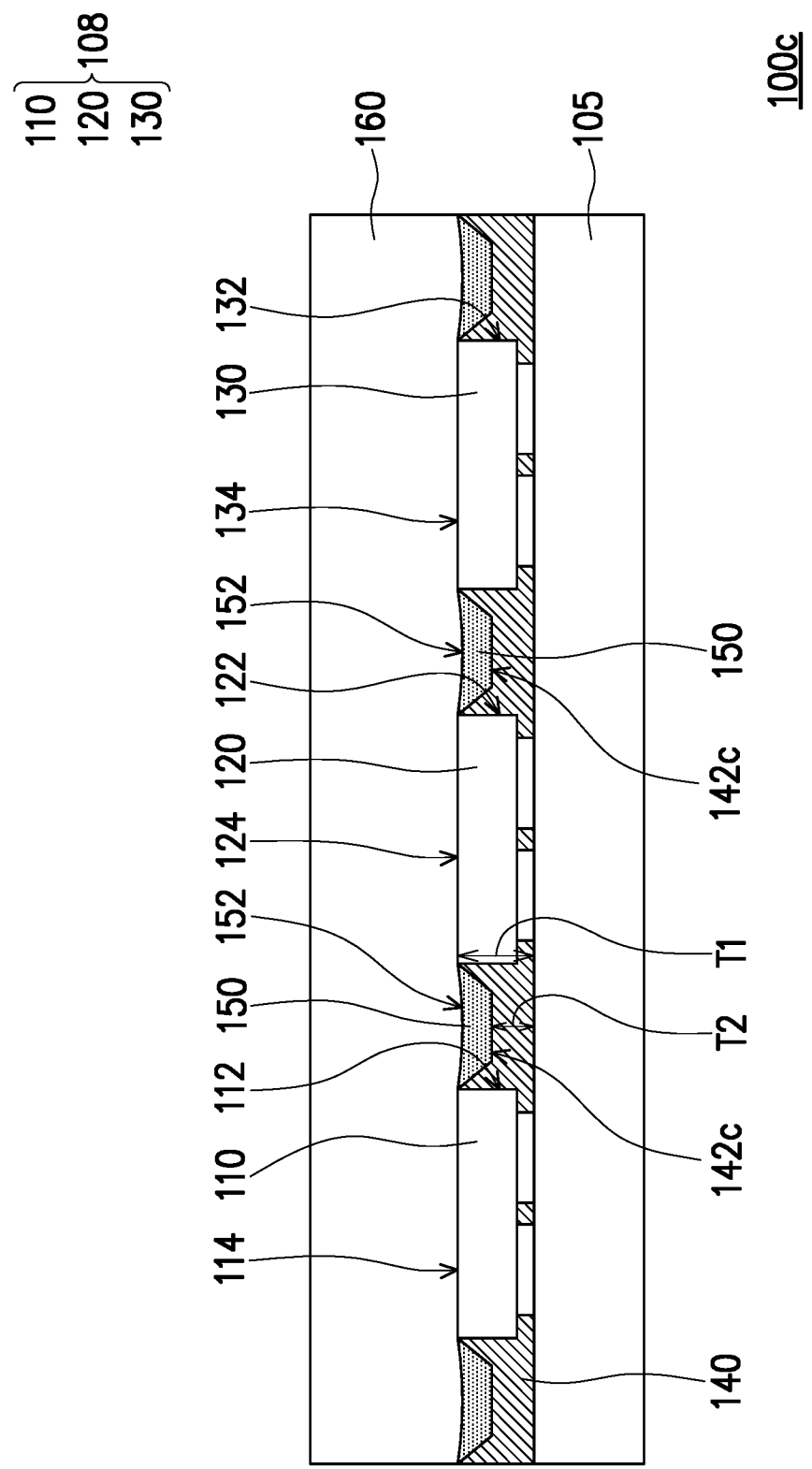
FIG. 4 and FIG. 5 are respectively schematic diagrams of partial profiles of various micro light-emitting diode display panels according to other embodiments of the disclosure.
Figure 5:
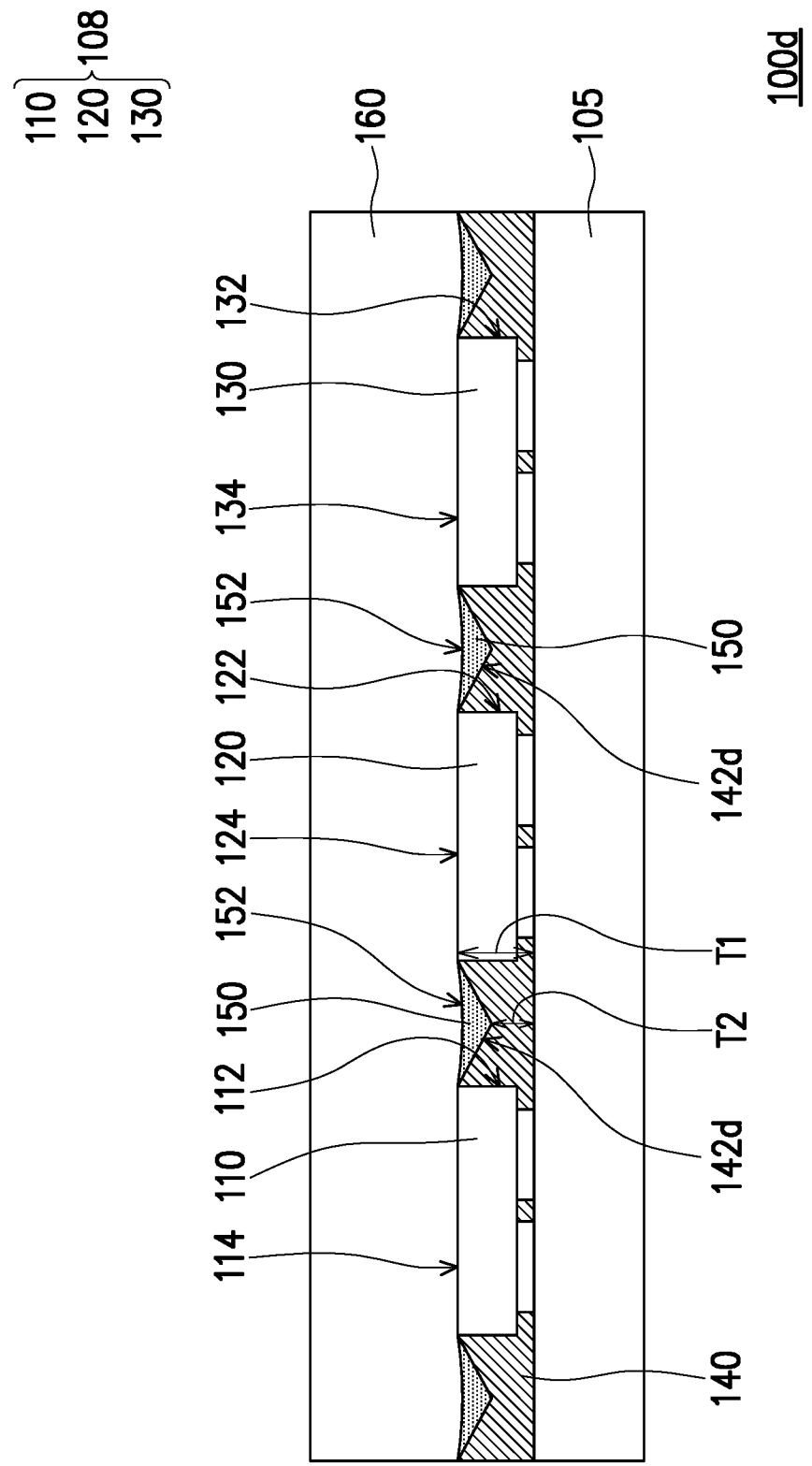

FIG. 4 and FIG. 5 are respectively schematic diagrams of partial profiles of various micro light-emitting diode display panels according to other embodiments of the disclosure. Please refer to FIG. 4. The main difference between a micro light-emitting diode display panel 100c of FIG. 4 and the micro light-emitting diode display panel 100 of FIG. 1 is: in FIG. 1, the cavity 142 has a concave arc shape. In the present embodiment, the shape of a cavity 142c of the reflective layer 140 has a partially chamfered conical shape (without a sharp point), and shows a trapezoid shape in cross section. Referring to FIG. 5, in a micro light-emitting diode display panel 100d of the present embodiment, a cavity 142d of the reflective layer 140 has an inverted conical shape, and shows an inverted triangular shape in cross section. The cavity can increase or decrease the light absorption of the light-absorbing layer 150 through the design of the shape, and is suitable for different micro light-emitting diode display panels. The shape of the cavity between any two micro light-emitting diodes may also be different, and the disclosure is not limited thereto.

Likewise, the shape of the cavity 142c of FIG. 4 and the shape of the cavity 142d of FIG. 5 may make the thickness T1 of the portion of the reflective layer 140 close to the first micro light-emitting diode 110, second micro light-emitting diode 120, and third micro light-emitting diode 130 greater than the thickness T2 of the portion of the reflective layer 140 away from the first micro light-emitting diode 110, the second micro light-emitting diode 120, and the third micro light-emitting diode 130. Of course, the shape of the cavity 142 of the reflective layer 140 is not limited thereto.

Figure 6:
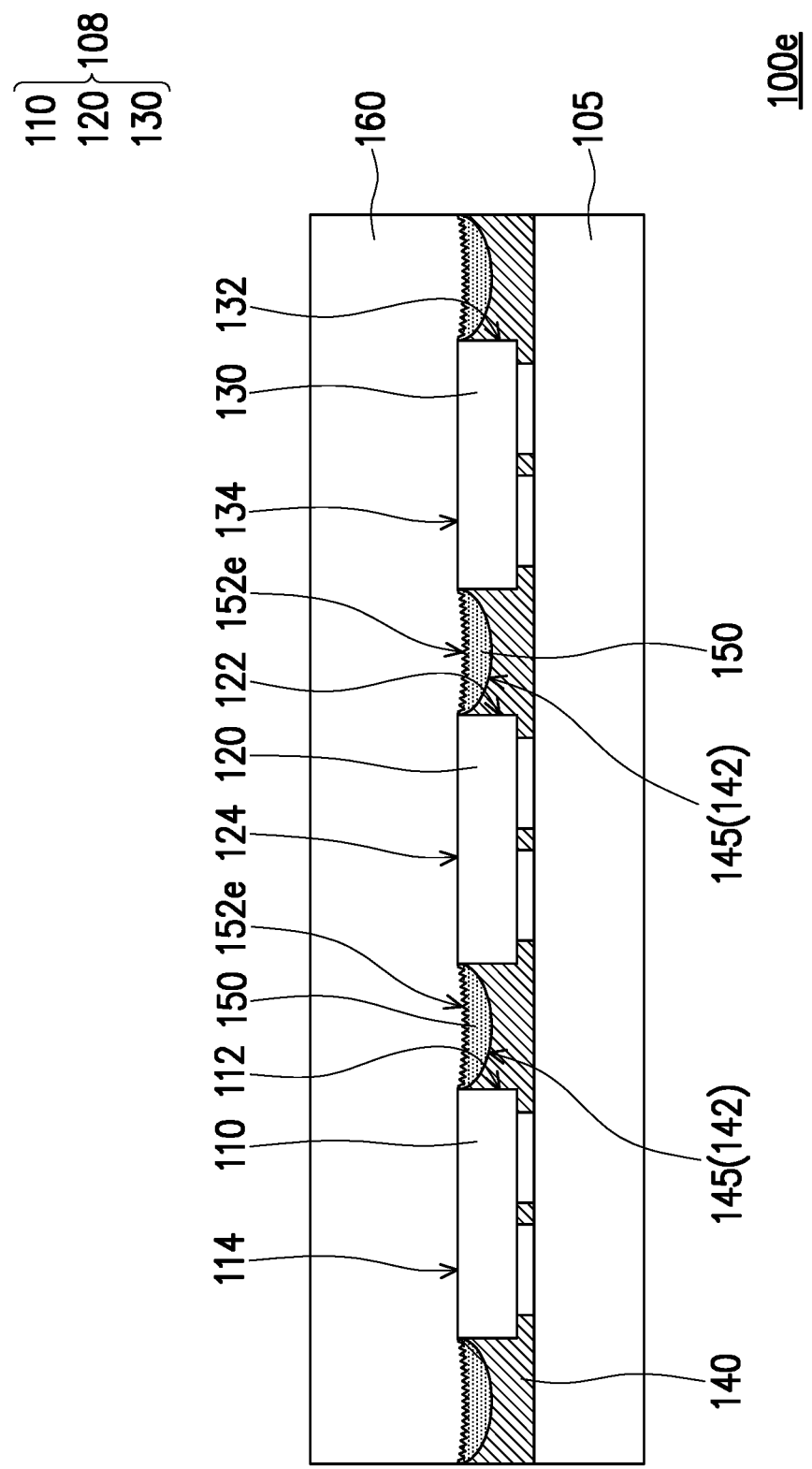
FIG. 6 is a schematic diagram of a partial profile of a micro light-emitting diode display panel according to another embodiment of the disclosure.

FIG. 6 is a schematic diagram of a partial profile of a micro light-emitting diode display panel according to another embodiment of the disclosure. Please refer to FIG. 6. The main difference between a micro light-emitting diode display panel 100e of FIG. 6 and the micro light-emitting diode display panel 100 of FIG. 1 is: in the present embodiment, a light-absorbing surface 152e of the light-absorbing layer 150 is a roughened surface with a non-periodic pattern, which can have an anti-glare function. However, in embodiments not shown, the roughened surface may also be a periodic pattern. The roughened surface may be formed by plasma bombardment, but the roughening method is not limited thereto.

Figure 7:
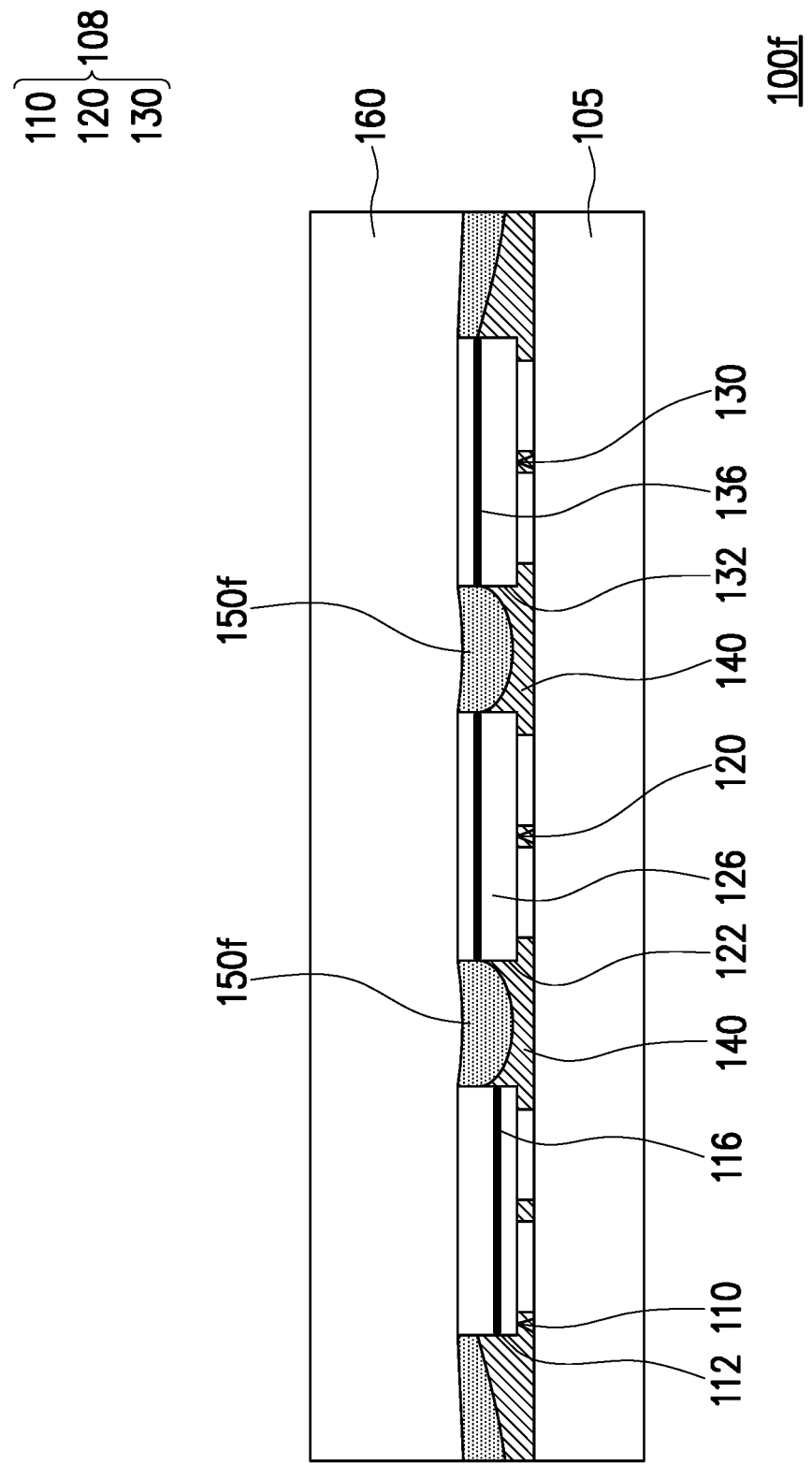
FIG. 7 is a schematic diagram of a partial profile of a micro light-emitting diode display panel according to another embodiment of the disclosure.

FIG. 7 is a schematic diagram of a partial profile of a micro light-emitting diode display panel according to another embodiment of the disclosure. Please refer to FIG. 7. The main difference between a micro light-emitting diode display panel 100f of FIG. 7 and the micro light-emitting diode display panel 100 of FIG. 1 is: in the present embodiment, a light-absorbing layer 150f contacts a portion of the first side wall 112 of the first micro light-emitting diode 110, a portion of the second side wall 122 of the second micro light-emitting diode 120, and a portion of the third side wall 132 of the third micro light-emitting diode 130.

In other words, in the present embodiment, the reflective layer 140 covers only a portion of the first side wall 112 of the first micro light-emitting diode 110, a portion of the second side wall 122 of the second micro light-emitting diode 120, and a portion of the third side wall 132 of the third micro light-emitting diode 130.

In particular, in the present embodiment, a first light-emitting layer 116 of the first micro light-emitting diode 110 is lower than a second light-emitting layer 126 of the second micro light-emitting diode 120 as well as a third micro light emitting layer 136 of the third micro light-emitting diode 130. Here, the reflective layer 140 covers 30% of the first side wall 112 of the first micro light-emitting diode 110, and the first light-emitting layer 116 of the first micro light-emitting diode 110 can thus be covered by the reflective layer 140. Therefore, the lateral light emitted by the first micro light-emitting diode 110 can be reflected back by the reflective layer 140. When the first micro light-emitting diode 110 is red light with poor luminous efficiency, the first light-emitting layer 116 is covered by the reflective layer 140, which can effectively increase the light-emitting efficiency of red light, thereby making the light-emitting efficiency of red light close to the light-emitting efficiency of blue light and the light-emitting efficiency of green light, thereby reducing color cast.

Figure 8:
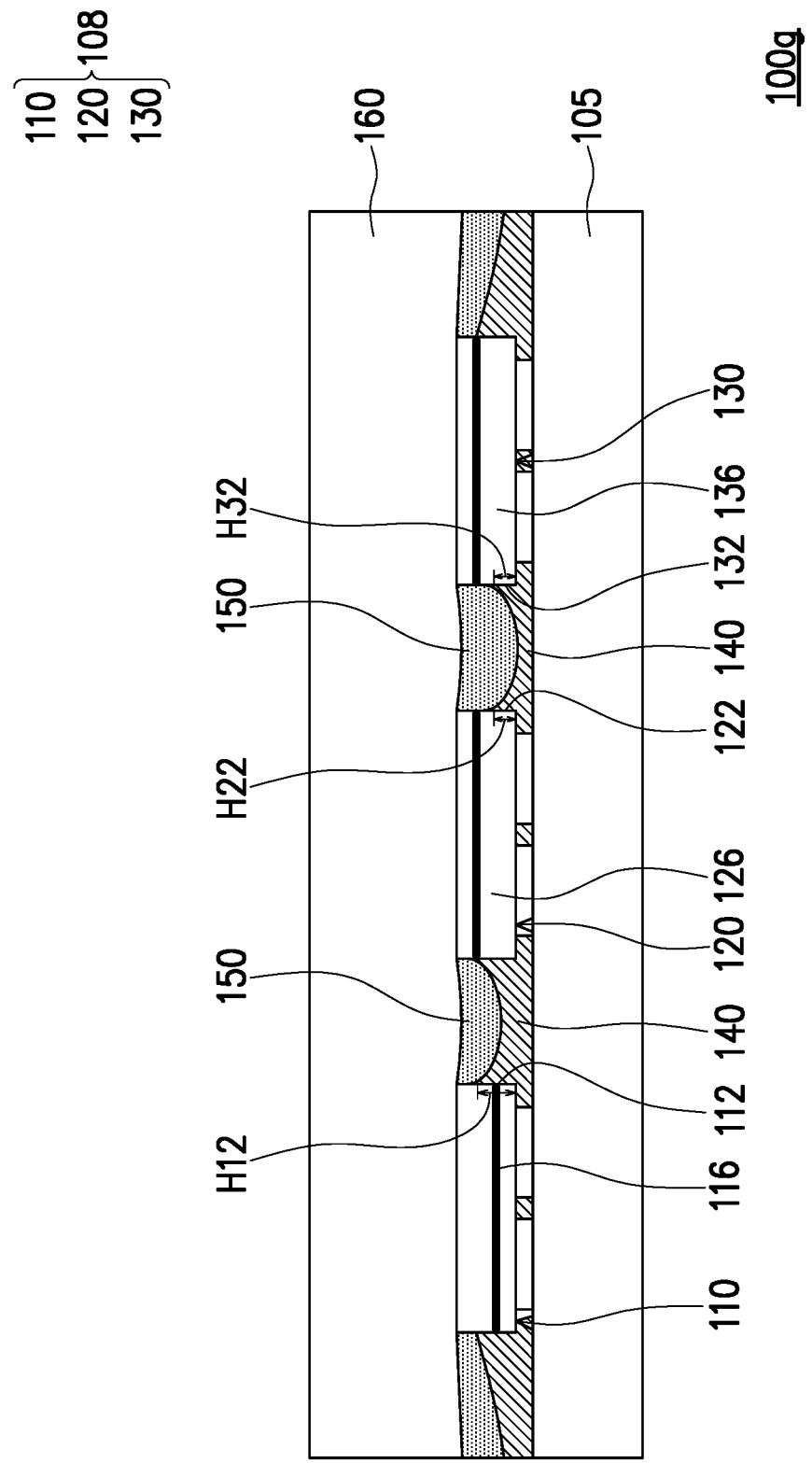
FIG. 8 is a schematic diagram of a partial profile of a micro light-emitting diode display panel according to another embodiment of the disclosure.

FIG. 8 is a schematic diagram of a partial profile of a micro light-emitting diode display panel according to another embodiment of the disclosure. Please refer to FIG. 8. The main difference between a micro light-emitting diode display panel 100g of FIG. 8 and the micro light-emitting diode display panel 100 of FIG. 1 is: in the present embodiment, a height H12 of the reflective layer 140 beside the first side walls 112 of the first micro light-emitting diode 110 is different from a height H22 of the reflective layer 140 beside to the second side walls 122 of the second micro light-emitting diode 120 and a height H32 of the reflective layer 140 beside the third side walls 132 of the third micro light-emitting diode 130.

Specifically, in the present embodiment, the reflective layer 140 contacts 70% to 100% of the first side wall 112 of the first micro light-emitting diode 110, 30% to 100% of the second side wall 122 of the second micro light-emitting diode 120, and 30% to 100% of the third side wall 132 of the third micro light-emitting diode 130.

Since the first micro light-emitting diode 110 emits red light with lower light-emitting efficiency, when the proportion of the reflective layer 140 contacting the first side wall 112 of the first micro light-emitting diode 110 is higher, to greater than or equal to 70%, the light-emitting efficiency of red light can be improved, thereby further improving the overall light-emitting performance of the micro light-emitting diode display panel 100.

Figure 9:
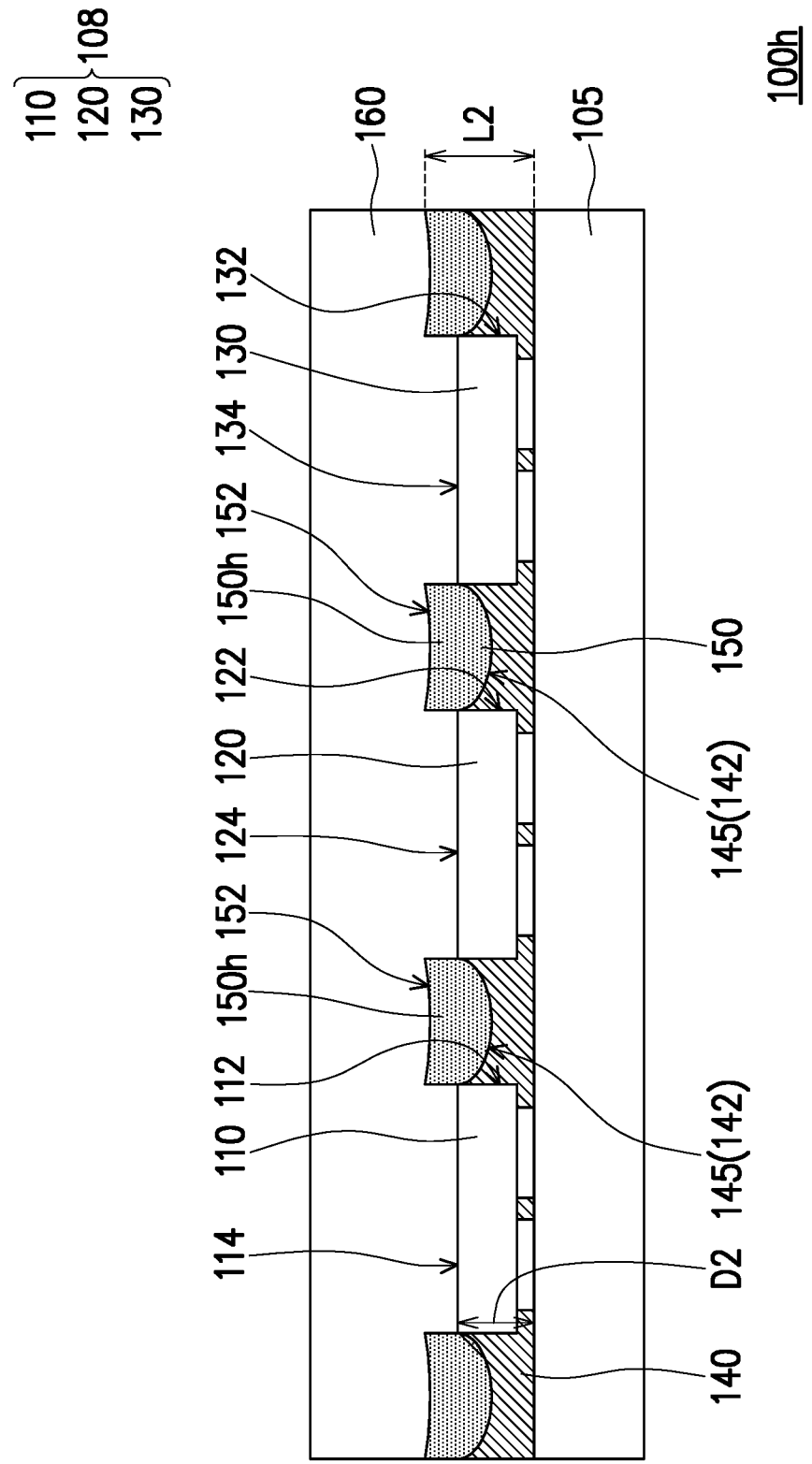
FIG. 9 is a schematic diagram of a partial profile of a micro light-emitting diode display panel according to another embodiment of the disclosure.

FIG. 9 is a schematic diagram of a partial profile of a micro light-emitting diode display panel according to another embodiment of the disclosure. Please refer to FIG. 9. The main difference between a micro light-emitting diode display panel 100h of FIG. 9 and the micro light-emitting diode display panel 100 of FIG. 1 is: in FIG. 1, a maximum distance L1 between the light-absorbing layer 150 and the substrate 105 is approximately equal to the distance D2 between the first top surface 114 of the first micro light-emitting diode 110 and the substrate 105. In other words, the light-absorbing layer 150 does not extend beyond the first top surface 114 of the first micro light-emitting diode 110.

In the present embodiment, a maximum distance L2 between a light-absorbing layer 150h and the substrate 105 is greater than the distance D2 between the first top surface 114 of the first micro light-emitting diode 110 and the substrate 105. Therefore, the light-absorbing layer 150h extends beyond the first top surface 114 of the first micro light-emitting diode 110. The designer may adjust the height of the light-absorbing layer 150h according to the contrast requirement so as to obtain the optimal contrast effect. In particular, the distance of the light-absorbing layer 150h beyond the first top surface 114 of the first micro light-emitting diode 110 may be less than or equal to 10 microns, so as to avoid too much light absorption by the excessively high light-absorbing layer 150h that may affect the light-emitting efficiency.

Figure 10:
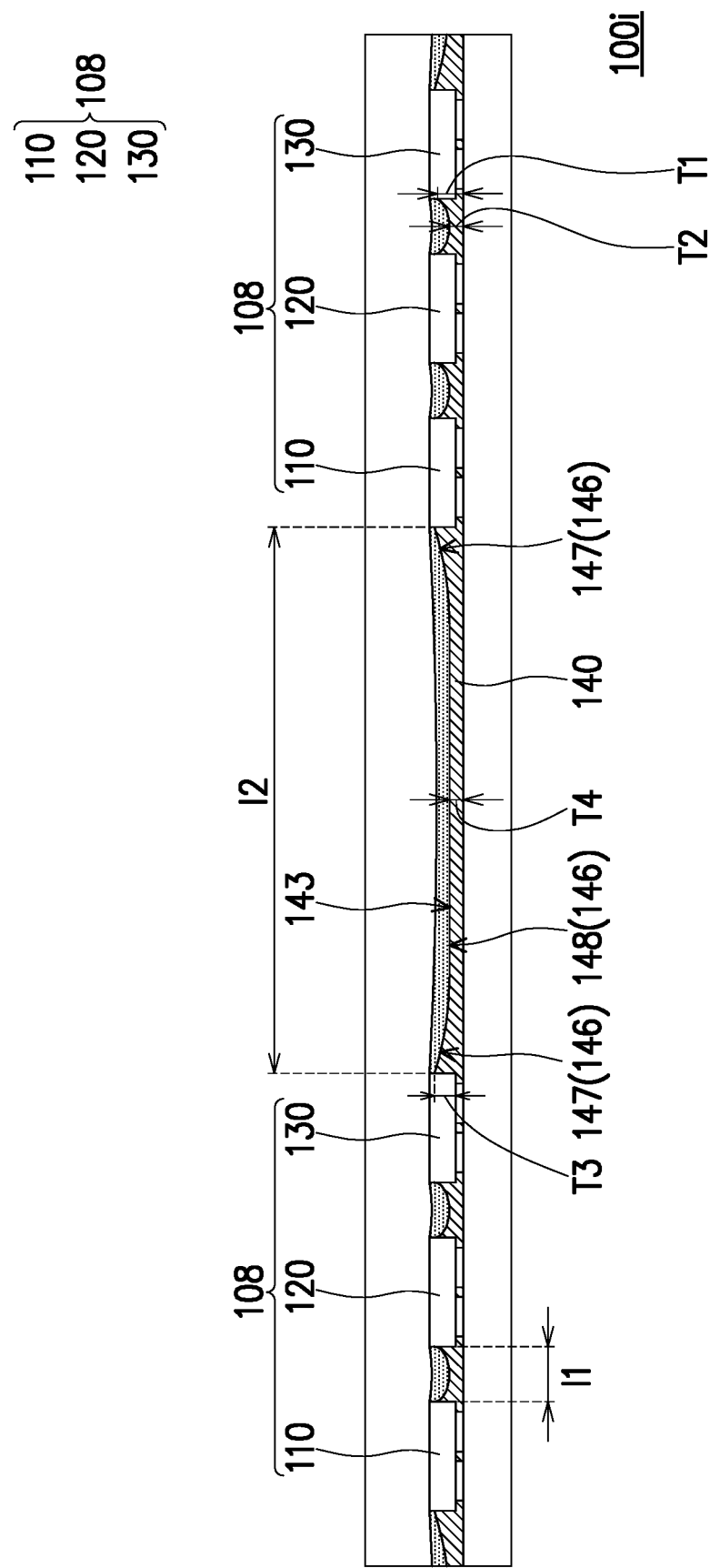
FIG. 10 is a schematic diagram of a partial profile of a micro light-emitting diode display panel according to another embodiment of the disclosure.

FIG. 10 is a schematic diagram of a partial profile of a micro light-emitting diode display panel according to another embodiment of the disclosure. Please refer to FIG. 10. A micro light-emitting diode display panel 100i in FIG. 10 is shown having two sets of the light-emitting element 108 as a schematic diagram.

In the present embodiment, a first interval I1 is provided between any two adjacent ones of the first micro light-emitting diode 110, the second micro light-emitting diode 120, and the third micro light-emitting diode 130 of each light-emitting element 108. A second interval I2 is provided between two of the light-emitting elements 108, and the second interval I2 is greater than the first interval I1. In an embodiment of the disclosure, the first interval I1 is between 1 μm and 50 μm, and the second interval I2 is between 50 μm and 300 μm. Of course, the sizes of the first interval I1 and the second interval I2 are not limited thereto.

A thickness T3 of the reflective layer 140 at a portion between the two light-emitting elements 108 close to the light-emitting elements 108 is greater than a thickness T4 of the reflective layer 140 at a portion away from the two light-emitting elements 108, such that the lateral light of the two light-emitting elements 108 can be better reflected, and the light-absorbing layer 150 can have a greater thickness in the middle of the two light-emitting elements 108 so as to improve the contrast. Preferably, the thickness T1 may be greater than or equal to the thickness T3, and the thickness T2 may be greater than or equal to the thickness T4, such that there can be better contrast between the two micro light-emitting diodes and the light-emitting elements.

Specifically, taking a cavity 143 of the reflective layer 140 between the two light-emitting elements 108 as example, the cavity 143 between the two light-emitting elements 108 has a reflective surface 146 away from the substrate 105. The reflective surface 146 includes a first portion 147 close to the two light-emitting elements 108 and a second portion 148 away from the two light-emitting elements 108, where a curvature of the first portion is greater than a curvature of the second portion, and the lateral light of the two light-emitting elements 108 can be better reflected. Here, the first portion 147 has a concave shape or a slope shape, and the second portion 148 has a plane shape.

Figure 11:
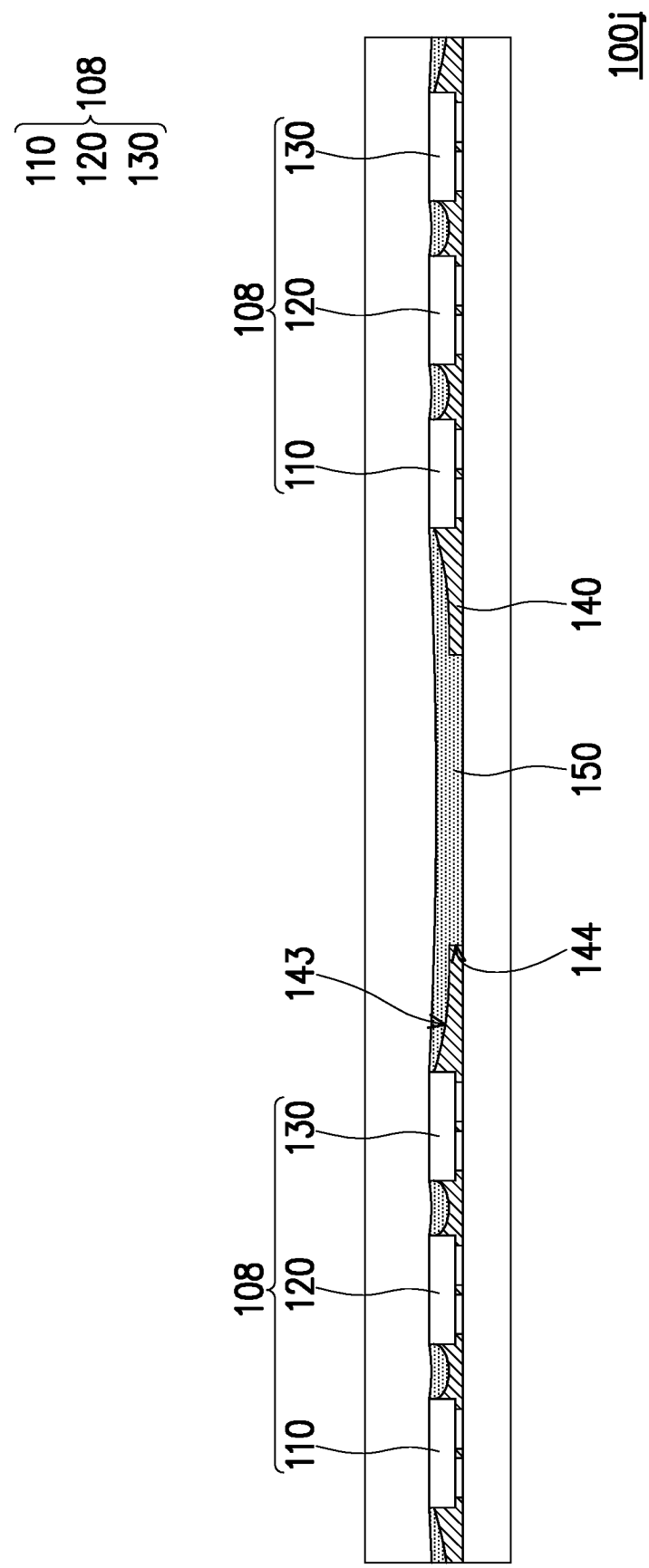
FIG. 11 is a schematic diagram of a partial profile of a micro light-emitting diode display panel according to another embodiment of the disclosure.

FIG. 11 is a schematic diagram of a partial profile of a micro light-emitting diode display panel according to another embodiment of the disclosure. Please refer to FIG. 11. The main difference between a micro light-emitting diode display panel 100j of FIG. 11 and the micro light-emitting diode display panel 100i of FIG. 10 is: in the present embodiment, the reflective layer 140 further includes a through hole 144 communicated with the cavity 143 between the two light-emitting elements 108, and the light-absorbing layer 150 fills the through hole 144 and contacts the substrate 105. With such design, the light-absorbing layer 150 is thicker between the two light-emitting elements 108, which can further improve the contrast.

Figure 12:
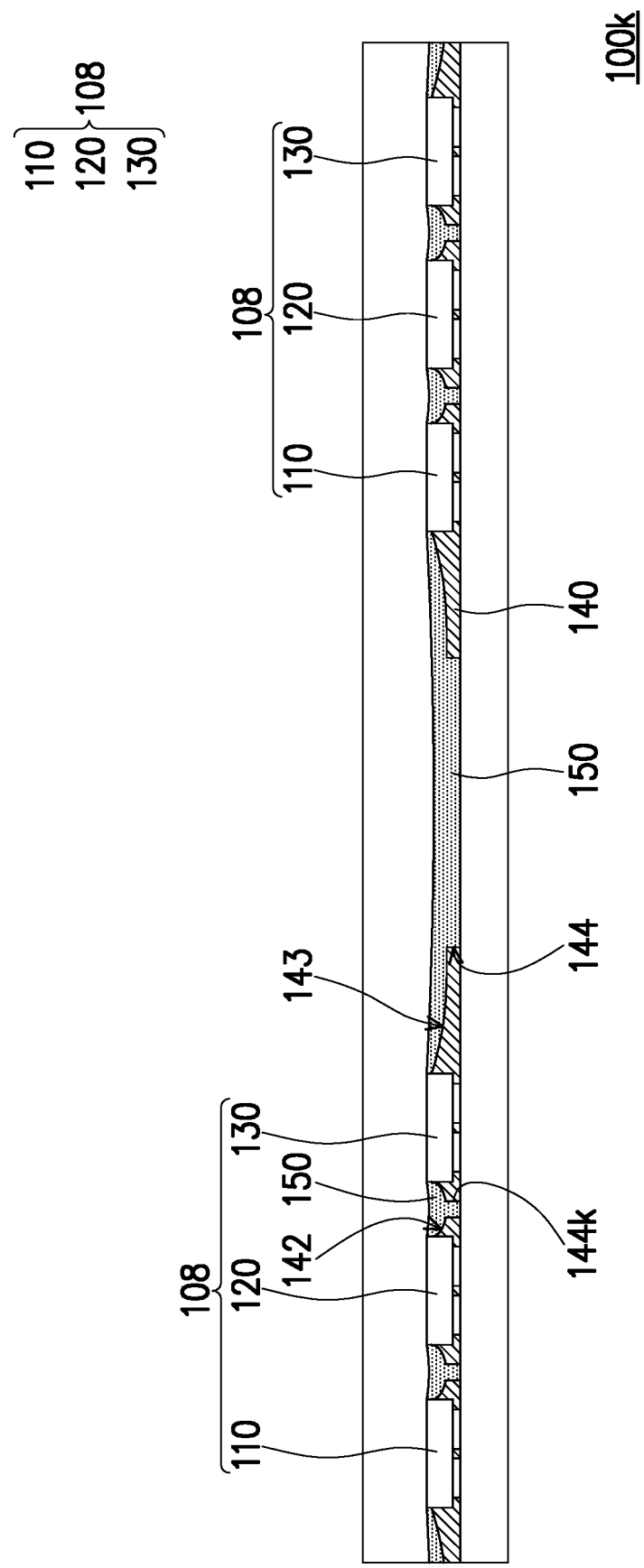
FIG. 12 is a schematic diagram of a partial profile of a micro light-emitting diode display panel according to another embodiment of the disclosure.

FIG. 12 is a schematic diagram of a partial profile of a micro light-emitting diode display panel according to another embodiment of the disclosure. Please refer to FIG. 12. The main difference between a micro light-emitting diode display panel 100k of FIG. 12 and the micro light-emitting diode display panel 100j of FIG. 11 is: in the present embodiment, the reflective layer 140 further includes multiple through holes 144k communicated with the cavities 142 inside each light-emitting element 108, such that the reflective layer 140 is separated into multiple independent blocks, where the first micro light-emitting diode 110, the second micro light-emitting diode 120, and the third micro light-emitting diode 130 are each surrounded by the reflective layer 140 of the different blocks. The light-absorbing layer 150 fills the through hole 144k and contacts the substrate 105. Such a design can improve the contrast in the pixel, and has a better contrast effect.

In summary, in the micro light-emitting diode display panel of the disclosure, the reflective layer is disposed on the substrate and located between the micro light-emitting diodes. The reflective layer has multiple cavities surrounding the micro light-emitting diodes, such that a thickness of a portion of the reflective layer close to any one of the micro light-emitting diodes is greater than a thickness of a portion of the reflective layer away from the corresponding micro light-emitting diode. The light-absorbing layer is at least disposed in the cavities of the reflective layer. With such design, the portion of the reflective layer close to the micro light-emitting diode is thicker, which can increase the reflective ratio, such that the lateral light of the micro light-emitting diode can be almost reflected, thereby improving the light-emitting efficiency. The portion of the reflective layer away from the micro light-emitting diode is thinner, such that a corresponding portion of the light-absorbing layer is thicker, which can increase the absorbance of the ambient light, so as to improve the color-light contrast. That is, with the double-layer structure design of disposing a reflective layer and a light-absorbing layer beside the micro light-emitting diodes, the micro light-emitting diode display panel of the disclosure can have high contrast and high brightness.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A micro light-emitting diode display panel, comprising:
a substrate;
at least one light-emitting element, disposed on the substrate to define at least one pixel, each of the at least one light-emitting element comprising a plurality of micro light-emitting diodes;
a reflective layer, disposed on the substrate and located between the micro light-emitting diodes, wherein the reflective layer has a plurality of cavities surrounding the plurality of micro light-emitting diodes, such that a thickness of a portion of the reflective layer close to any one of the micro light-emitting diodes is greater than a thickness of a portion of the reflective layer away from the corresponding micro light-emitting diode; and
a light-absorbing layer, at least disposed in the plurality of cavities of the reflective layer, wherein a first interval is provided between any two adjacent micro light-emitting diodes of the micro light-emitting diodes, the at least one light-emitting element comprises two light-emitting elements, and a second interval is provided between the two light-emitting elements; the second interval is greater than the first interval, and a thickness of the reflective layer in a portion between the two light-emitting elements close to the two light-emitting elements is greater than a thickness of the reflective layer in a portion between the two light-emitting elements away from the two light-emitting elements.

2. The micro light-emitting diode display panel as described in claim 1, wherein each of the micro light-emitting diodes comprises a top surface away from the substrate, and a depth of each of the plurality of cavities is less than or equal to a distance from the top surface to the substrate.

3. The micro light-emitting diode display panel as described in claim 1, wherein a width of a portion of the reflective layer between any two adjacent micro light-emitting diodes of the micro light-emitting diodes is greater than or equal to a width of a corresponding portion of the light-absorbing layer.

4. The micro light-emitting diode display panel as described in claim 3, wherein a ratio of a width of the light-absorbing layer to a width of the reflective layer is between 0.9 and 1.

5. The micro light-emitting diode display panel as described in claim 1, wherein the plurality of micro light-emitting diodes comprise a first micro light-emitting diode, a second micro light-emitting diode, and a third micro light-emitting diode, light emitted by the first micro light-emitting diode, light emitted by the second micro light-emitting diode, and light emitted by the third micro light-emitting diode have different wavelengths.

6. The micro light-emitting diode display panel as described in claim 5, wherein the wavelength of the light emitted by the first micro light-emitting diode is greater than the wavelength of the light emitted by the second micro light-emitting diode as well as the light emitted by the third micro light-emitting diode, and a light-emitting layer of the first micro light-emitting diode is surrounded by the reflective layer.

7. The micro light-emitting diode display panel as described in claim 5, wherein the first micro light-emitting diode, the second micro light-emitting diode, the third micro light-emitting diode respectively comprises a plurality of first side walls, a plurality of second side walls, and a plurality of third side walls, and the reflective layer contacts 30% to 100% of each of the plurality of first side walls, 30% to 100% of each of the plurality of second side walls, and 30% to 100% of each of the plurality of third side walls.

8. The micro light-emitting diode display panel as described in claim 7, wherein a height of the reflective layer beside the plurality of first side walls is different from a height of the reflective layer beside the plurality of third side walls.

9. The micro light-emitting diode display panel as described in claim 8, wherein the reflective layer contacts 70% to 100% of each of the plurality of first side walls, 30% to 100% of each of the plurality of second side walls, and 30% to 100% of each of the plurality of third side walls.

10. The micro light-emitting diode display panel as described in claim 7, wherein the light-absorbing layer contacts a portion of each of the plurality of first side walls, a portion of each of the plurality of second side walls, and a portion of each of the plurality of third side walls.

11. The micro light-emitting diode display panel as described in claim 1, wherein the light-absorbing layer has a light-absorbing surface away from the reflective layer, and the light-absorbing surface is a concave surface.

12. The micro light-emitting diode display panel as described in claim 1, wherein each of the micro light-emitting diodes comprises a top surface away from the substrate, and a maximum distance between the light-absorbing layer and the substrate is greater than or equal to a distance between the top surface and the substrate.

13. The micro light-emitting diode display panel as described in claim 1, wherein the reflective layer further comprises a plurality of through holes communicated with the plurality of cavities, and the light-absorbing layer fills the through holes and contacts the substrate.

14. The micro light-emitting diode display panel as described in claim 1, wherein the first interval is between 1 μm and 50 μm, and the second interval is between 50 μm and 300 μm.

15. The micro light-emitting diode display panel as described in claim 1, wherein an optical density of the light-absorbing layer is greater than 1, and a reflectivity of the reflective layer is greater than 50%.

\* \* \* \* \*